(12) United States Patent
Xiao et al.

(10) Patent No.: US 8,942,057 B1
(45) Date of Patent: Jan. 27, 2015

(54) SERIAL ADVANCED TECHNOLOGY ATTACHMENT DUAL IN-LINE MEMORY MODULE DEVICE

(71) Applicant: ScienBiziP Consulting (Shen Zhen) Co., Ltd., Shenzhen (CN)

(72) Inventors: Gui-Fu Xiao, Shenzhen (CN); Cheng-Fei Weng, Shenzhen (CN)

(73) Assignee: ScienBiziP Consulting (Shenzhen) Co., Ltd., Guangdong (CN)

( * ) Notice: Subject to any disclaimer, the term of this patent is extended or adjusted under 35 U.S.C. 154(b) by 0 days.

(21) Appl. No.: 14/062,584

(22) Filed: Oct. 24, 2013

(30) Foreign Application Priority Data

Aug. 12, 2013 (CN) .............................. 201310347950

(51) Int. Cl.
  *G11C 7/00* (2006.01)
  *G11C 5/14* (2006.01)
(52) U.S. Cl.
  CPC ...................................... *G11C 5/143* (2013.01)
  USPC ................. 365/228; 365/51; 365/52; 365/63; 361/784

(58) Field of Classification Search
  USPC .......................... 365/228, 51, 52, 63; 361/784
  See application file for complete search history.

(56) References Cited

U.S. PATENT DOCUMENTS

| | | | | | |
|---|---|---|---|---|---|
| 5,974,500 | A | * | 10/1999 | Maletsky et al. | 711/103 |
| 7,633,767 | B2 | * | 12/2009 | Lee | 361/803 |
| 8,514,584 | B2 | * | 8/2013 | Liang et al. | 361/785 |
| 2013/0114230 | A1 | * | 5/2013 | Zhou et al. | 361/803 |
| 2013/0166809 | A1 | * | 6/2013 | Xiao et al. | 710/305 |

* cited by examiner

*Primary Examiner* — Connie Yoha
(74) *Attorney, Agent, or Firm* — Novak Druce Connolly Bove + Quigg LLP

(57) ABSTRACT

When a measured current of a resistor is less than a preset current value after a device is inserted into a memory slot, a control chip and a storage chip does not receive voltages. When the measured current is not less than the preset current value and a count time reaches a preset time value, the control chip and the storage chip receive voltages, to read or write data. When measured current of the resistor is not less than the preset current value after the device is removed from the memory slot, the control chip and the storage chip receive voltages, to backup data. When the measured current is less than the preset current value and the count time reaches the preset time value, the control chip and the storage chip do not receive voltages.

8 Claims, 3 Drawing Sheets

SERIAL ADVANCED TECHNOLOGY ATTACHMENT DUAL IN-LINE MEMORY MODULE DEVICE

BACKGROUND

1. Technical Field

The present disclosure relates to a serial advanced technology attachment dual in-line memory module (SATA DIMM) device.

2. Description of Related Art

Solid state drives (SSD) store data on chips instead of on magnetic or optical discs and are used for adding storage capacity. One type of SSD has the form factor of a dual in-line memory module (DIMM) device and is called a serial advanced technology attachment (SATA) DIMM device. The SATA DIMM device can be inserted into a memory slot of a motherboard to receive voltages from the motherboard through the memory slot and receive hard disk drive (HDD) signals through a SATA connector of the SATA DIMM device connected to a SATA connector on the motherboard. However, when the SATA DIMM device operates abnormally, the SATA DIMM device needs to be removed from the memory slot before being repaired after the computer system is powered off. The repaired SATA DIMM device then can be inserted into the memory slot again before the computer system is powered on. This is tedious and time-consuming. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of example and not by way of limitation. References to "an" or "one" embodiment in this disclosure are not necessarily to the same embodiment, and such references mean "at least one."

Figure 1:
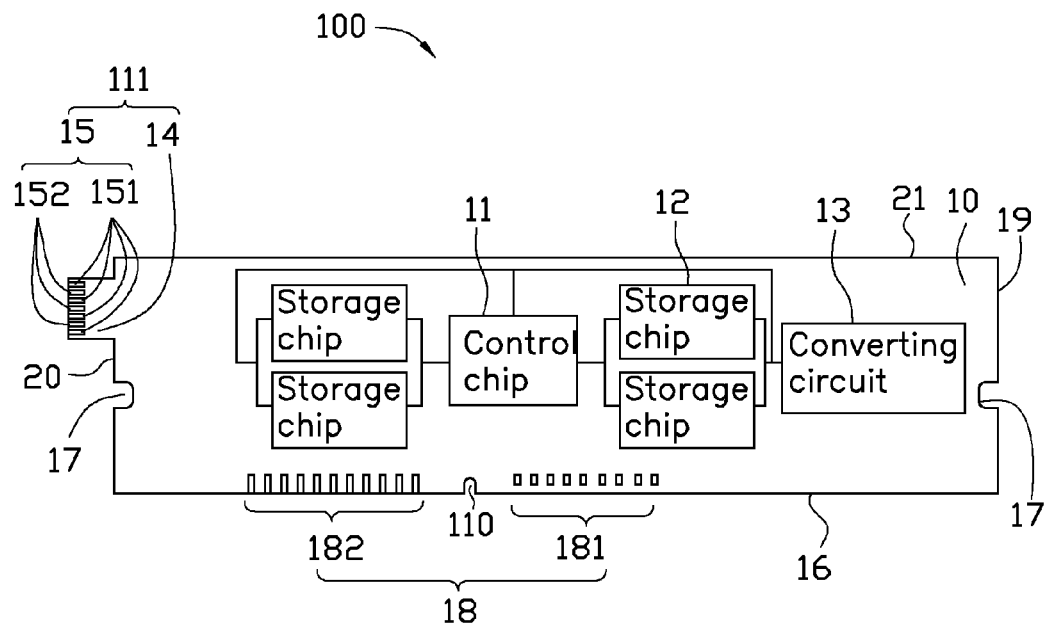
FIG. 1 is a side plan view of a serial advanced technology attachment dual in-line memory module (SATA DIMM) device in accordance with an embodiment of the present disclosure, wherein the SATA DIMM device includes a converting circuit.
Figure 2:
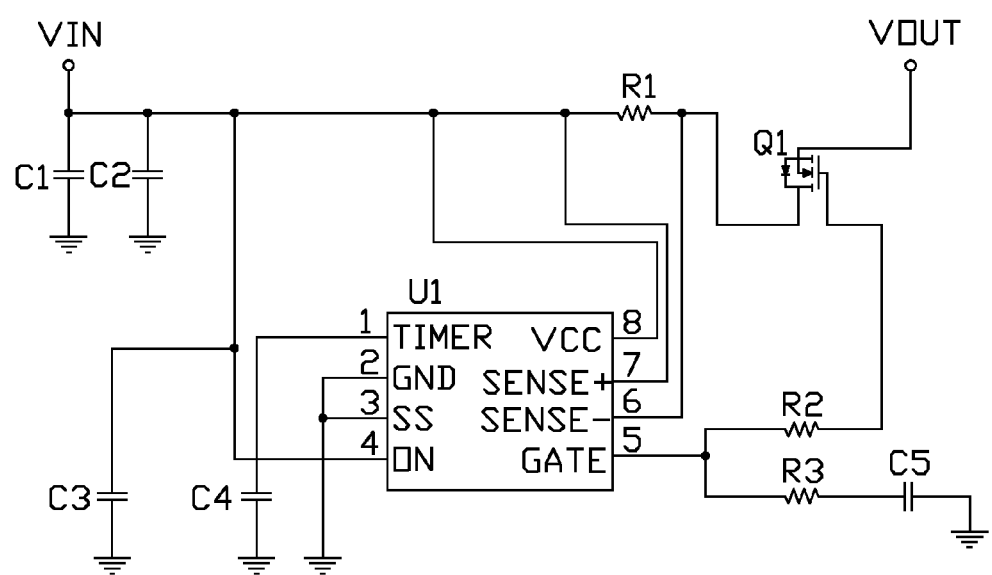
FIG. 2 is a circuit diagram of the converting circuit of the SATA DIMM device of FIG. 1.
Figure 3:
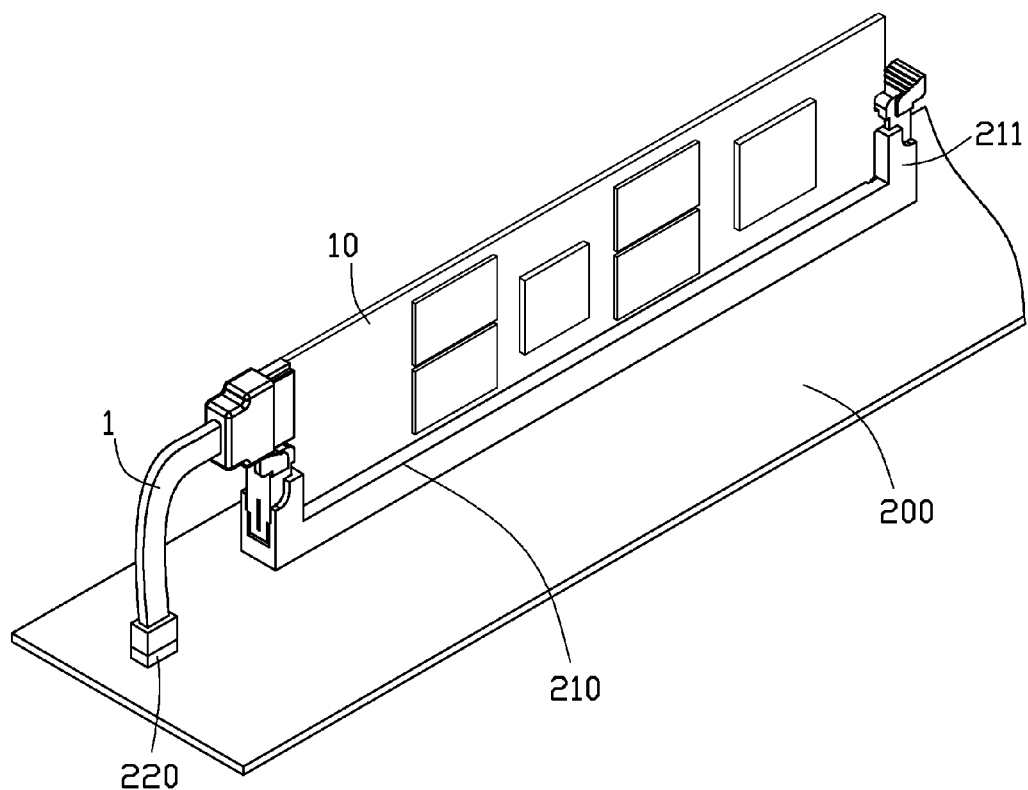
FIG. 3 is an assembled, isometric view of the SATA DIMM device of FIG. 1 connected to a motherboard.

FIGS. 1 to 3 show a serial advanced technology attachment dual in-line memory module (SATA DIMM) device 100 in accordance with an embodiment. The SATA DIMM device 100 includes a substantially rectangular circuit board 10. A control chip 11, a plurality of storage chips 12, and a converting circuit 13 are all arranged on the circuit board 10. The control chip 11 and the storage chips 12 are connected to a voltage output terminal VOUT of the converting circuit 13, to receive a voltage from the converting circuit 13. The control chip 11 is connected to the storage chips 12, to control the storage chips 12 to read or to write data.

An extending board 14 is extended from a first end 20 of the circuit board 10 and coplanar with the circuit board 10. An edge connector 15 is arranged on the extending board 14. The edge connector 15 and the extending board 14 compose a storage device connector 111. The edge connector 15 includes a plurality of signal pins 151 and a plurality of ground pins 152. The signal pins 151 include a pair of signal input pins and a pair of signal output pins. The ground pins 152 include three ground pins. The signal pins 151 are connected to the control chip 11. The ground pins 152 are connected to a ground layer (not shown) of the circuit board 10. The edge connector 15 is in accordance with SATA standard.

An edge connector 18 and a notch 110 are arranged on a bottom side 16 of the circuit board 10, to be inserted into a memory slot 210 of a motherboard 200. The edge connector 18 includes a plurality of power pins 181 and a plurality of ground pins 182. The notch 110 is defined between the power pins 181 and the ground pins 182. A length of each ground pin 182 is greater than a length of each power pin 181. A top end of each power pin 181 is aligned with a top end of each ground pin 182. A bottom end of each power pin 181 is spaced from an edge of the bottom side 16 of the circuit board 10. The power pins 181 are connected to a voltage input terminal VIN of the converting circuit 13, to provide a voltage received from the motherboard 200 to the converting circuit 13. The ground pins 182 are connected to the ground layer (not shown) of the circuit board 10. A groove 17 is defined in the first end 20 of the circuit board 10 and is positioned under the extending board 14. Another groove 17 is defined in a second end 19 of the circuit board 10 opposite to the first end 20.

The converting circuit 13 includes capacitors C1-C5, resistors R1-R3, an electronic switch, such as an n-channel field effect transistor (FET) Q1, and a converting chip U1. The converting chip U1 stores a preset current value, such as 50 milliamperes (mA), and a preset time value, such as 0.5 milliseconds (ms). A timing pin TIMER of the converting chip U1 is grounded through the capacitor C4. The preset time value of the converting chip U1 can be set through changing capacitance of the capacitor C4. Ground pins GND and SS of the converting chip U1 are grounded. A reset pin ON of the converting chip U1 is connected to the voltage input terminal VIN. The capacitors C1 and C2 are connected in parallel, between the voltage input terminal VIN and ground. The capacitor C3 is connected between the reset pin ON of the converting chip U1 and ground. A voltage pin VCC of the converting chip U1 is connected to the voltage input terminal VIN and a first end of the resistor R1. A second end of the resistor R1 is connected to a drain of the FET Q1. A sensing pin SENSE+ of the converting chip U1 is connected to the first end of the resistor R1. A sensing pin SENSE− of the converting chip U1 is connected to the second end of the resistor R1. A source of the FET Q1 is connected to the voltage output terminal VOUT. A control pin GATE of the converting chip U1 is connected to a gate of the FET Q1 through the resistor R2, and connected to ground through the resistor R3 and the capacitor C5 in that order. In one embodiment, capacitance of the capacitor C1 is not less than 4.7 microfarads (μF), to avoid an over-current pulse when the SATA DIMM device 100 is inserted into the memory slot 210.

In use, when the edge connector 18 is inserted into the memory slot 210 of the motherboard 200, the ground pins 182 are electrically connected to ground pins of the memory slot 210, and then the power pins 181 are electrically connected to power pins of the memory slot 210. Fixing elements 211 of the memory slot 210 engage in the grooves 17, to fix the SATA DIMM device 100 in the memory slot 210. The storage device connector 111 is connected to a storage device port 220 through a cable 1 with two SATA connectors. The voltage input terminal VIN receives a voltage from the motherboard 200 through the power pins 181. The converting chip U1 measures a current of the resistor R1 through the sensing pins SENSE+ and SENSE− and compares the measured current with the preset current value. When the measured current is less than the preset current value, the control pin GATE of the converting chip U1 outputs a low level signal to the gate of the FET Q1. The FET Q1 maintains being turned off. The voltage output terminal VOUT does not output a voltage. When the measured current is equal to or greater than the preset current value, the converting chip U1 counts time. When the count time reaches the preset time value, the control pin GATE of the converting chip U1 outputs a high level signal to the gate of the FET Q1. The FET Q1 is turned on. The voltage output terminal VOUT outputs a stable voltage to the control chip 11 and the storage chips 12. At the same time, the control chip 11 receives a SATA signal from the motherboard 200 through the storage device connector 111, to control the storage chips 12 to read or to write data.

When the SATA DIMM device 100 needs to be removed from the memory slot 210, the power pins 181 are disconnected from the power pins of the memory slot 210, and then the ground pins 182 are disconnected from the ground pins of the memory slot 210. The voltage input terminal VIN does not receive a voltage from the motherboard 200. The capacitor C1 discharges. The converting chip U1 measures a current of the resistor R1 through the sensing pins SENSE+ and SENSE− and compares the measured current with the preset current value. When the measured current is equal to or greater than the preset current value, the control pin GATE of the converting chip U1 maintains the high level signal to the gate of the FET Q1. The FET Q1 maintains being turned on. The voltage output terminal VOUT outputs a stable voltage to the control chip 11 and the storage chips 12, to backup data. When the measured current is less than the preset current value, the converting chip U1 counts time. When the count time reaches the preset time value, the control pin GATE of the converting chip U1 outputs a low level signal to the gate of the FET Q1. The FET Q1 is turned off. The voltage output terminal VOUT does not output a voltage.

When the SATA DIMM device 100 is inserted into the memory slot 210, the converting circuit 13 provides a stable voltage received from the motherboard 200 to the control chip 11 and the storage chips 12, to allow communication between the SATA DIMM device 100 and the motherboard 200. When the SATA DIMM device 100 is removed from the memory slot 210, the converting circuit 13 discharges a delay voltage to the control chip 11 and the storage chips 12, to backup data. The SATA DIMM device 100 is simple in operation and time-saving.

Even though numerous characteristics and advantages of the disclosure have been set forth in the foregoing description, together with details of the structure and function of the disclosure, the disclosure is illustrative only, and changes may be made in detail, especially in matters of shape, size, and the arrangement of parts within the principles of the disclosure to the full extent indicated by the broad general meaning of the terms in which the appended claims are expressed.

What is claimed is:

1. A serial advanced technology attachment dual in-line memory module (SATA DIMM) device comprising:
   a circuit board;
   a converting circuit arranged on the circuit board and comprising a voltage input terminal and a voltage output terminal;
   a plurality of storage chips arranged on the circuit board and connected to the voltage output terminal of the converting circuit, to receive a voltage from the converting circuit;
   a control chip arranged on the circuit board and connected to the voltage output terminal of the converting circuit, to receive a voltage from the converting circuit, wherein the control chip is connected to the plurality of storage chips for controlling the plurality of storage chips to read or to write data;
   an extending board extended from a first end of the circuit board and coplanar with the circuit board, wherein a first edge connector is arranged on the extending board and communicates with a storage device port of a motherboard, the first edge connector comprises a plurality of first signal pins connected to the control chip and a plurality of first ground pins grounded; and
   a second edge connector and a notch arranged on a bottom side of the circuit board, to be inserted into a memory slot of the motherboard, wherein the second edge connector comprises a plurality of second power pins and a plurality of second ground pins, a length of each of the plurality of second ground pins is greater than a length of each of the plurality of second power pins, the plurality of second power pins is connected to the voltage input terminal of the converting circuit, to provide a voltage received from the motherboard to the converting circuit, the plurality of second ground pins is grounded;
   wherein the converting circuit further comprises first and second capacitors, a first resistor, an electronic switch, and a converting chip, the converting chip stores a preset current value and a preset time value, a timing pin of the converting chip is grounded through the first capacitor, first and second ground pins of the converting chip are grounded, a reset pin of the converting chip is connected to the voltage input terminal and also grounded through the second capacitor, a voltage pin of the converting chip is connected to the voltage input terminal and a first end of the first resistor, a second end of the first resistor is connected to a first terminal of the electronic switch, a first sensing pin of the converting chip is connected to the first end of the first resistor, a second sensing pin of the converting chip is connected to the second end of the first resistor, a second terminal of the electronic switch is connected to the voltage output terminal, a control pin of the converting chip is connected to a control terminal of the electronic switch; when the control terminal of the electronic switch receives a high level signal, the first and second terminals of the electronic switch are connected to each other, when the control terminal of the electronic switch receives a low level signal, the first and second terminals of the electronic switch are disconnected from each other; and
   wherein when the SATA DIMM device is inserted into the memory slot, the voltage input terminal receives a voltage from the motherboard, the first and second sensing pins of the converting chip measure a current of the first resistor and compares the measured current with the preset current value, when the measured current is less than the preset current value, the control pin of the converting chip outputs a low level signal to the control terminal of the electronic switch, the electronic switch is turned off, the voltage output terminal does not output a voltage; when the measured current is equal to or greater than the preset current value, the converting chip counts time, when the count time reaches the preset time value, the control pin of the converting chip outputs a high level signal to the control terminal of the electronic switch, the electronic switch is turned on, the voltage output terminal outputs a stable voltage to the control chip and the plurality of storage chips, the control chip receives a SATA signal from the motherboard through the first edge connector and controls the plurality of storage chips to read or to write data; when the SATA DIMM device is removed from the memory slot, the voltage input terminal does not receive a voltage from the motherboard, the second capacitor discharges, the first and second sensing pins of the converting chip measure a current of the first resistor and compares the measured current with the preset current value, when the measured current is equal to or greater than the preset current value, the control pin of the converting chip outputs a high level signal to the control terminal of the electronic switch, the electronic switch maintains being turned on, the voltage output terminal outputs a stable voltage to the control chip and the plurality of storage chips, to backup data, when the measured current is less than the preset current value, the converting chip counts time, when the count time reaches the preset time value, the control pin of the converting chip outputs a low level signal to the control terminal of the electronic switch, the electronic switch is turned off, the voltage output terminal does not output a voltage.

2. The SATA DIMM device of claim 1, wherein the extending board and the first edge connector compose a storage device connector, the storage device connector is in accordance with SATA standard.

3. The SATA DIMM device of claim 1, wherein the plurality of first signal pins comprises a pair of signal input pins and a pair of signal output pins, the plurality of first ground pins comprises three ground pins.

4. The SATA DIMM device of claim 1, wherein a top end of each of the plurality of second power pins is aligned with a top end of each of the plurality of second ground pins, a bottom end of each of the plurality of second power pins is spaced from an edge at the bottom side of the circuit board.

5. The SATA DIMM device of claim 1, wherein the electronic switch is a n-channel field effect transistor (FET), the control terminal, the first terminal, and the second terminal of the electronic switch are correspond to a gate, a drain, and a source of the FET.

6. The SATA DIMM device of claim 1, wherein the converting circuit further comprises third to fifth capacitors and second and third resistors, the third capacitor is connected between the voltage input terminal and ground, the fourth capacitor is connected between the reset pin of the converting chip and ground, the second resistor is connected between the control pin of the converting chip and the control terminal of the electronic switch, the control pin of the converting chip is grounded through the third resistor and the fifth capacitor in that order.

7. The SATA DIMM device of claim 1, wherein the preset time value stored in the converting chip can be set by changing capacitance of the first capacitor.

8. The SATA DIMM device of claim 1, wherein capacitance of the first capacitor is not less than 4.7 microfarads.

* * * * *